US012701869B2

(12) United States Patent
Jo et al.

(10) Patent No.: US 12,701,869 B2
(45) Date of Patent: Aug. 4, 2026

(54) DISPLAY PANEL AND METHOD OF MANUFACTURING THE SAME

(71) Applicant: Samsung Display Co., Ltd., Yongin-si (KR)

(72) Inventors: Wonje Jo, Yongin-si (KR); Che Ho Lee, Yongin-si (KR); Soyeon Jeong, Yongin-si (KR); Jungsu Kim, Yongin-si (KR); Young Seo Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 339 days.

(21) Appl. No.: 18/468,134

(22) Filed: Sep. 15, 2023

(65) Prior Publication Data

US 2024/0172484 A1 May 23, 2024

(30) Foreign Application Priority Data

Nov. 21, 2022 (KR) ........................ 10-2022-0156518

(51) Int. Cl.
*H10K 59/122* (2023.01)
*H10K 59/12* (2023.01)
*H10K 59/80* (2023.01)

(52) U.S. Cl.
CPC ....... *H10K 59/122* (2023.02); *H10K 59/1201* (2023.02); *H10K 59/873* (2023.02)

(58) Field of Classification Search
CPC ....... H10K 50/00–88; H10K 59/00–95; H10K 65/00; H10K 71/00–861; H10K 85/00–791; H10K 2101/00–90; H10K 2102/00–361; H10K 59/873; H10K 59/122; H10K 59/173; B32B 2457/206; H01L 21/447–449; H01L 21/463; H01L 21/603–607; H01L 23/28–3192; H01L 21/56–568; H01L 2924/181–186; H10W 74/00–481
See application file for complete search history.

(56) References Cited

U.S. PATENT DOCUMENTS

| | | | |
|---|---|---|---|
| 9,818,811 B2 | 11/2017 | Shin et al. | |
| 11,456,437 B2 | 9/2022 | Kim | |
| 12,284,901 B2 | 4/2025 | Seo et al. | |
| 2007/0090752 A1* | 4/2007 | Makiura | .............. H10K 50/171 |
| | | | 313/506 |

(Continued)

FOREIGN PATENT DOCUMENTS

| | | |
|---|---|---|
| KR | 10-2010-0020167 | 2/2010 |
| KR | 10-0999538 | 12/2010 |

(Continued)

*Primary Examiner* — Matthew C Landau
*Assistant Examiner* — Nora T. Nix
(74) *Attorney, Agent, or Firm* — CANTOR COLBURN LLP

(57) ABSTRACT

A method of manufacturing a display panel includes providing a work substrate including a first electrode and a pixel-defining layer including an opening exposing at least a part of the first electrode, forming a spacer on the pixel-defining layer, forming a light-emitting layer on the first electrode by providing a deposition material to a mask including a deposition opening corresponding to the opening, removing the mask, and compressing particles remaining on the spacer by a compression tool.

19 Claims, 13 Drawing Sheets

(56)          References Cited

U.S. PATENT DOCUMENTS

| 2013/0248891 | A1* | 9/2013 | Kim | ..................... | H10K 77/111 |
| | | | | | 438/34 |
| 2015/0171150 | A1* | 6/2015 | Ha | ....................... | H10K 71/231 |
| | | | | | 438/34 |
| 2016/0240404 | A1* | 8/2016 | Burn | ................... | H10P 72/0428 |

FOREIGN PATENT DOCUMENTS

| KR | 20130107529 | A | 10/2013 |
| KR | 20150071318 | A | 6/2015 |
| KR | 10-1941178 | | 1/2019 |
| KR | 10-2020-0050120 | | 5/2020 |
| KR | 20220031837 | A | 3/2022 |
| KR | 10-2022-0092173 | | 7/2022 |

* cited by examiner

FIG. 5C

MS-OP
MS
SP
PDL
30
20
10
BFL
SUB

SU

EU

OP

EML

AE

ES EA EG ED
TR

DR3
DR2
DR1

DISPLAY PANEL AND METHOD OF MANUFACTURING THE SAME

CROSS-REFERENCE TO RELATED APPLICATION(S)

This application claims priority to and benefits of Korean Patent Application No. 10-2022-0156518 under 35 U.S.C. § 119, filed on Nov. 21, 2022, in the Korean Intellectual Property Office (KIPO), the entire contents of which are incorporated herein by reference.

BACKGROUND

1. Technical Field

The disclosure herein relates to a display panel including a planarized inorganic encapsulation layer and a method of manufacturing the same.

2. Description of the Related Art

Various display devices used in a multimedia device such as a television, a mobile phone, a tablet computer, a navigation system, and a game console are being developed. Light-emitting display panels are being developed. Each pixel in a light-emitting display panel may include a light-emitting element. A display panel may include an encapsulation layer for protecting the light-emitting element. The encapsulation layer may include multiple inorganic layers and an organic layer disposed between the inorganic layers.

SUMMARY

The disclosure provides a display panel including a planarized inorganic encapsulation layer formed on a pixel-defining layer.

The disclosure also provides a method of manufacturing a display panel with which a planarized inorganic encapsulation layer may be formed on a pixel.

According to an embodiment of the disclosure, a method of manufacturing a display panel may include providing a work substrate including a first electrode and a pixel-defining layer including an opening exposing at least a portion of the first electrode, forming a spacer on the pixel-defining layer, forming a light-emitting layer on the first electrode by providing a deposition material to a mask including a deposition opening corresponding to the opening, removing the mask, and compressing particles remaining on the spacer by a compression tool.

In an embodiment, each of the particles and the deposition material may include a same material.

In an embodiment, the spacer may include polyimide.

In an embodiment, the method may further include forming a second electrode covering the light-emitting layer and the pixel-defining layer.

In an embodiment, the method may further include forming a cover layer covering the second electrode.

In an embodiment, the method may further include forming a first inorganic layer covering the cover layer, forming an organic layer covering the first inorganic layer, and forming a second inorganic layer covering the organic layer. An upper surface of the first inorganic layer overlapping the particles in a plan view may be flat.

In an embodiment, the compression tool and the mask may have a same shape in a plan view.

In an embodiment, the compression tool may compress the particles at a temperature in a range of about 30° C. to about 100° C.

In an embodiment, in the compressing of the particles, the particles may be compressed onto an upper surface of the spacer.

In an embodiment, in the compressing of the particles, at least a part of each of the particles may be inserted from an upper surface of the spacer into the spacer.

In an embodiment, in the compressing of the particles, at least some of the particles may be adhered to the compression tool and removed from the spacer.

In an embodiment, the compression tool may include a compression part and a coating layer disposed under the compression part, and the at least some of the particles may be adhered to the coating layer and removed from the spacer.

In an embodiment, a sum of a thickness of the pixel-defining layer and a thickness of the spacer after the compressing of the particles may be less than the sum of the thickness of the pixel-defining layer and the thickness of the spacer before the compressing of the particles in a thickness direction of the work substrate.

In an embodiment of the disclosure, a display panel may include a circuit element layer including a transistor and disposed on a base layer, a display element layer including first electrodes electrically connected to the transistor, a second electrode disposed in common on the first electrodes, light-emitting layers, each disposed between a corresponding one of the first electrodes and the second electrode, a pixel-defining layer including openings exposing at least a portion of each of the first electrodes and covered by the second electrode, a spacer disposed between the pixel-defining layer and the second electrode, and particles disposed between the spacer and the second electrode, and an encapsulation layer disposed on the display element layer. Each of the particles and the light-emitting layers may include a same material.

In an embodiment, the encapsulation layer may include a first inorganic layer disposed on the second electrode, a second inorganic layer disposed on the first inorganic layer, and an organic layer disposed between the first inorganic layer and the second inorganic layer.

In an embodiment, the display element layer may further include a cover layer disposed between the second electrode and the first inorganic layer.

In an embodiment of the disclosure, a display panel may include a pixel including a transistor, a first electrode electrically connected to the transistor, a second electrode disposed on the first electrode, and a light-emitting layer disposed between the first electrode and the second electrode, a pixel-defining layer including an opening exposing at least a part of the first electrode and covered by the second electrode, a spacer disposed between the pixel-defining layer and the second electrode, particles disposed between the spacer and the second electrode, and an encapsulation layer including a first inorganic layer disposed on the second electrode, a second inorganic layer disposed on the first inorganic layer, and an organic layer disposed between the first inorganic layer and the second inorganic layer. An upper surface of the first inorganic layer overlapping the particles in a plan view may be flat.

In an embodiment, each of the particles and the light-emitting layer may include a same material.

In an embodiment, the display panel may further include a cover layer disposed between the second electrode and the first inorganic layer.

In an embodiment, the spacer may include polyimide.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain principles of the disclosure. In the drawings:

FIG. 5C is a schematic cross-sectional view of a method of manufacturing a display panel according to an embodiment of the disclosure;

DETAILED DESCRIPTION OF THE EMBODIMENTS

Figure 1:
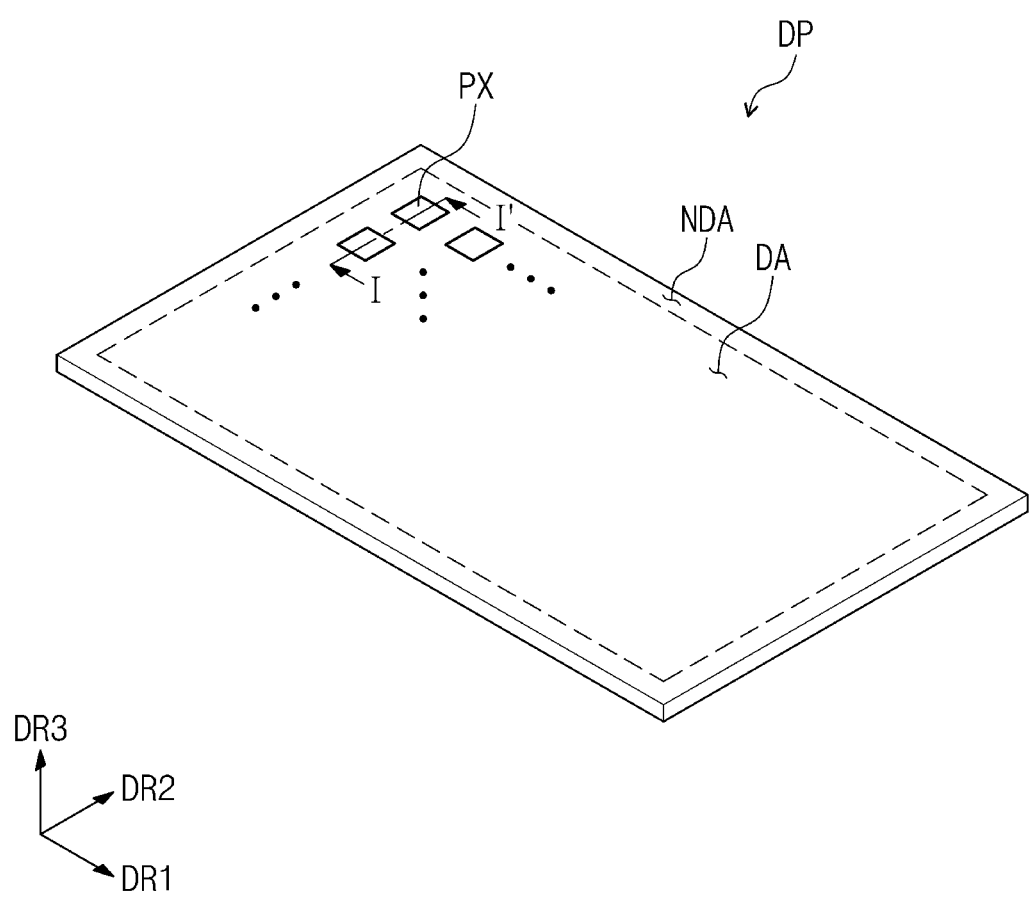
FIG. 1 is a perspective view of a display panel according to an embodiment of the disclosure.

In this specification, when a component (or region, layer, portion, etc.) is referred to as "on", "connected", or "coupled" to another component, it means that it is placed/connected/coupled directly on the other component or a third component can be disposed between them.

The same reference numerals or symbols refer to the same elements. In addition, in the drawings, thicknesses, ratios, and dimensions of components are exaggerated for effective description of technical content. "And/or" includes all combinations of one or more that the associated elements may define.

Terms such as first and second may be used to describe various components, but the components should not be limited by the terms. These terms are only used for the purpose of distinguishing one component from other components. For example, without departing from the scope of the disclosure, a first component may be referred to as a second component, and similarly, a second component may be referred to as a first component. Singular expressions include plural expressions unless the context clearly indicates otherwise.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used in this specification have the same meaning as commonly understood by one of ordinary skill in the art to which this disclosure belongs. In addition, terms such as terms defined in commonly used dictionaries should be interpreted as having a meaning consistent with the meaning having in the context of the related technology, and should not be interpreted as too ideal or too formal unless explicitly defined here.

Hereinafter, embodiments of the disclosure will be described with reference to the drawings.

Figure 2:
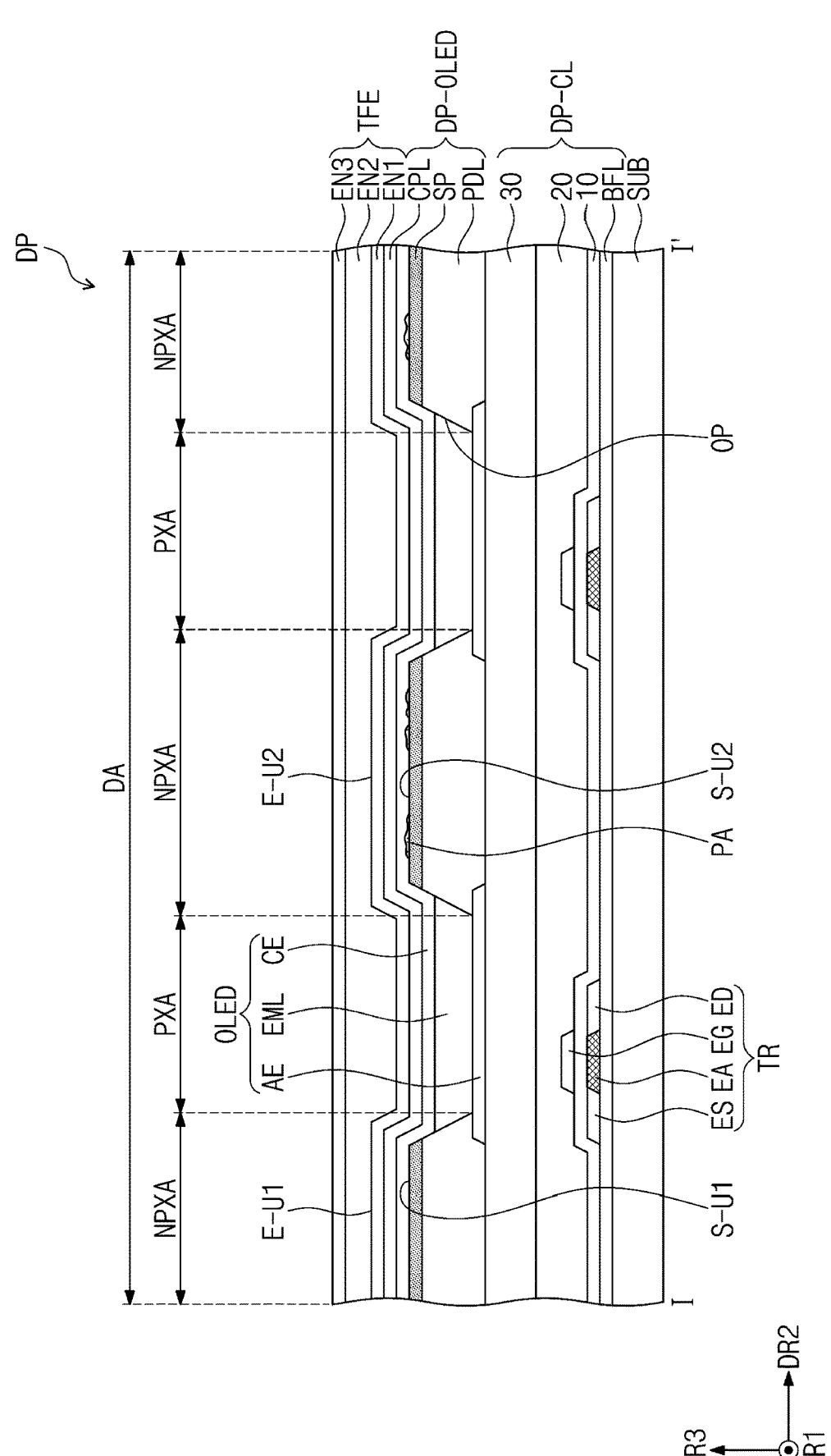
FIG. 2 is a schematic cross-sectional view taken along line I-I' in FIG. 1 according to an embodiment.

FIG. 1 is a perspective view of a display panel according to an embodiment of the disclosure. FIG. 2 is a schematic cross-sectional view taken along line I-I' in FIG. 1 according to an embodiment.

As illustrated in FIG. 1, a display panel DP may include a display region DA and a non-display region NDA disposed adjacent to the display region DA, on a plane defined by a first direction DR1 and a second direction DR2 intersecting each other. A thickness direction of the display panel DP may be a third direction DR3. The front surface (or upper surface) and the rear surface (or lower surface) of each member may be defined based on the third direction DR3. However, directions indicated by the first to third directions DR1, DR2, and DR3 are relative concepts, and may be changed.

The display panel DP according to an embodiment may be a flat rigid display panel. However, the disclosure is not limited thereto, and the display panel according to an embodiment may be a flexible display panel. The display panel DP may be applied to not only a large-sized electronic device such as a television or a monitor, but also a small- or medium-sized electronic device such as a mobile phone, a tablet computer, a car navigation, a game console, or a smartwatch.

As illustrated in FIG. 1, multiple pixels PX may be disposed in the display region DA. The pixels PX may not be disposed in the non-display region NDA.

The pixels PX may each include a display element and a driving circuit for operating the display element. The display element may be a light-emitting element, and may include a light-emitting diode. The driving circuit may include multiple transistors and at least one capacitor. FIG. 2 schematically illustrates an organic light-emitting element OLED as the light-emitting element, and a single transistor TR as the driving circuit, however, the disclosure is not limited thereto.

Referring to FIG. 2, the display panel DP may include a base layer SUB, a circuit element layer DP-CL, a display element layer DP-OLED, and an encapsulation layer TFE which are sequentially stacked. The base layer SUB may include a synthetic resin layer. The synthetic resin layer may be formed on a support substrate used in manufacture of the display panel DP. A conductive layer, an insulating layer, etc., may be formed on the synthetic resin layer. In case that the support substrate is removed, the synthetic resin layer may correspond to the base layer SUB.

The circuit element layer DP-CL may include at least one inorganic layer, at least one organic layer, and a circuit element. The circuit element layer DP-CL may include a buffer layer BFL, a first insulating layer 10, a second insulating layer 20, and a third insulating layer 30 which are sequentially stacked on the base layer SUB. The first insulating layer 10 and the second insulating layer 20 may each be an inorganic layer, and the third insulating layer 30 may be an organic layer.

A semiconductor pattern may be disposed on the buffer layer BFL. The semiconductor pattern may include a silicon semiconductor. The semiconductor pattern may include polysilicon. However, the disclosure is not limited thereto, and the semiconductor pattern may include amorphous silicon. The semiconductor pattern may include a metal oxide semiconductor.

The semiconductor pattern may have different electrical properties according to whether being doped or not. The semiconductor pattern may include a first region and a second region different from the first region. The first region may be doped with an N-type dopant or a P-type dopant. A P-type transistor may include a doped region doped with a P-type dopant.

The first region may have a greater conductivity than the second region, and substantially serve as an electrode or a signal line. The second region may substantially correspond to an active (or channel) of a transistor. For example, a portion of the semiconductor pattern may be an active (or channel) of the transistor, and another portion of the of the semiconductor pattern may be a source (or input electrode region), or a drain (or output electrode region), and the other portion of the semiconductor pattern may be a connection signal line (or connection electrode).

As illustrated in FIG. 2, a source ES, an active EA, and a drain ED of the transistor TR may be formed from the semiconductor pattern. Although not shown separately, the transistor TR may be connected to the organic light-emitting element OLED through a conductive structure. In another embodiment, the driving circuit may include multiple transistors, and another transistor (not illustrated) may be connected (e.g., directly connected) to the organic light-emitting element OLED.

A control electrode EG may be disposed on the first insulating layer 10 and overlap the active EA in a plan view. The second insulating layer 20 may cover the control electrode EG.

The display element layer DP-OLED may be disposed on the third insulating layer 30. The display element layer DP-OLED may include a pixel-defining layer PDL and the organic light-emitting element OLED. The pixel-defining layer PDL may include an organic material. A first electrode AE may be disposed on the third insulating layer 30. An opening OP may be defined on the pixel-defining layer PDL. The opening OP of the pixel-defining layer PDL may expose at least a portion of the first electrode AE.

The exposed portion of the first electrode AE may be defined as a light-emitting region PXA. A non-light-emitting region NPXA may be disposed adjacent to the light-emitting region PXA.

The display panel DP according to an embodiment may further include a spacer SP disposed on the pixel-defining layer PDL. The spacer SP may be disposed on an upper surface of the pixel-defining layer PDL in the non-light-emitting region NPXA. A thickness of the spacer SP may be less than a thickness of the pixel-defining layer PDL in the third direction DR3. The spacer SP according to an embodiment may include an organic material. For example, the spacer SP may include polyimide.

The organic light-emitting element OLED according to an embodiment may further include a hole control layer disposed between the first electrode AE and a light-emitting layer EML. The hole control layer may be disposed in common in the light-emitting region PXA and the non-light-emitting region NPXA. The hole control layer may include a hole transport layer. The hole control layer may further include a hole injection layer. Although not separately shown, a common layer such as the hole control layer may be formed in common in the pixels PX (see FIG. 1).

The light-emitting layer EML may be disposed on the first electrode AE. The light-emitting layer EML may be disposed in a region corresponding to the opening OP. In an embodiment, the light-emitting layer EML may be separately formed in each of the pixels PX. The light-emitting layer EML may include an organic material and/or an inorganic material. The light-emitting layer EML according to an embodiment may be formed by applying a deposition material in a deposition process using a mask (for example, fine metal mask (FMM)) including multiple deposition openings corresponding to the openings OP.

During the deposition process, the mask may be disposed on the spacer SP. Accordingly, the mask may be supported by the spacer SP. In the display panel DP according to an embodiment, a damage applied by the mask during the deposition process may be protected by the spacer SP, thereby providing the display panel DP with improved reliability.

The display panel DP according to an embodiment may include particles PA disposed on the spacer SP. The particles PA may be formed because the deposition material remaining on the mask after the deposition may remain on the spacer SP after removal of the mask. Accordingly, the particles PA and the deposition material forming the light-emitting layer EML may include a same material.

The particles PA according to an embodiment may not be disposed on a first upper surface S-U1 of the spacer SP, and may be disposed only on a second upper surface S-U2 of the spacer SP.

In case that a process for forming a second electrode CE, a cover layer CPL, and a first inorganic layer EN1 of the encapsulation layer TFE is performed without performing a compression process on the particles PA while the particles PA remain on the second upper surface S-U2 of the spacer SP, a step coverage of the first inorganic layer EN1 may be smaller on the second upper surface S-U2 where the particles PA are disposed than on the first upper surface S-U1 where the particles PA are not disposed due to thicknesses of the particles PA. Accordingly, the first inorganic layer EN1 overlapping the second upper surface S-U2 may be disconnected, or a crack may occur in the first inorganic layer EN1.

According to an embodiment, since the second electrode CE, the cover layer CPL, and the first inorganic layer EN1 of the encapsulation layer TFE are formed after the particles PA are compressed onto the spacer SP through a compression process to be described below, the first inorganic layer EN1 overlapping the spacer SP may be formed flat on the upper surfaces S-U1 and S-U2 of the spacer SP.

For example, a portion E-U1 of the first inorganic layer EN1 on the first upper surface S-U1 on which the particles PA are not disposed, and another portion E-U2 of the first inorganic layer EN1 on the second upper surface S-U2 on which the particles PA are disposed may have substantially a same flatness. Accordingly, the display panel DP with an improved step coverage of the first inorganic layer EN1 may be provided. A process for compressing the particles PA will be described below.

FIG. 2 illustrates a patterned light-emitting layer EML, but the disclosure is not limited thereto, and according to an embodiment, the light-emitting layer EML may be disposed in common in the pixels PX (see FIG. 1). In the embodiment, the light-emitting layer EML may generate white light or blue light.

The second electrode CE may be disposed on the light-emitting layer EML. The second electrode CE may be disposed in common in the pixels PX. For example, the second electrode CE may be disposed integrally in the pixels PX. For example, the second electrode CE may be disposed integrally on the first electrode AE.

The organic light-emitting element OLED according to an embodiment may further include an electron control layer disposed between the light-emitting layer EML and the second electrode CE. Although not separately shown, the electron control layer may be formed in common in the pixels PX (see FIG. 1). The electron control layer may include an electron transport layer. The electron control layer may further include the electron injection layer.

The encapsulation layer TFE may be disposed in common in the pixels PX. The encapsulation layer TFE may include multiple thin film layers. The encapsulation layer TFE according to an embodiment may include first to third thin film layers EN1, EN2, and EN3 which are sequentially stacked. The first to third thin film layers EN1, EN2, and EN3 may each be one of an inorganic layer and an organic layer. The inorganic layer may protect the organic light-emitting element OLED from moisture and/or oxygen. The organic layer may protect the organic light-emitting element OLED from foreign matters such as dust particles. However, as long as being capable of protecting the organic light-emitting element OLED or improving the light-emitting efficiency, the configuration of the encapsulation layer TFE is not limited to what is illustrated.

The display panel DP according to an embodiment may further include the cover layer CPL disposed between the second electrode CE and the first inorganic layer EN1.

The cover layer CPL may cover (e.g., directly cover) the second electrode CE to protect the second electrode CE in a following process. The cover layer CPL may include an organic material.

Figure 3:
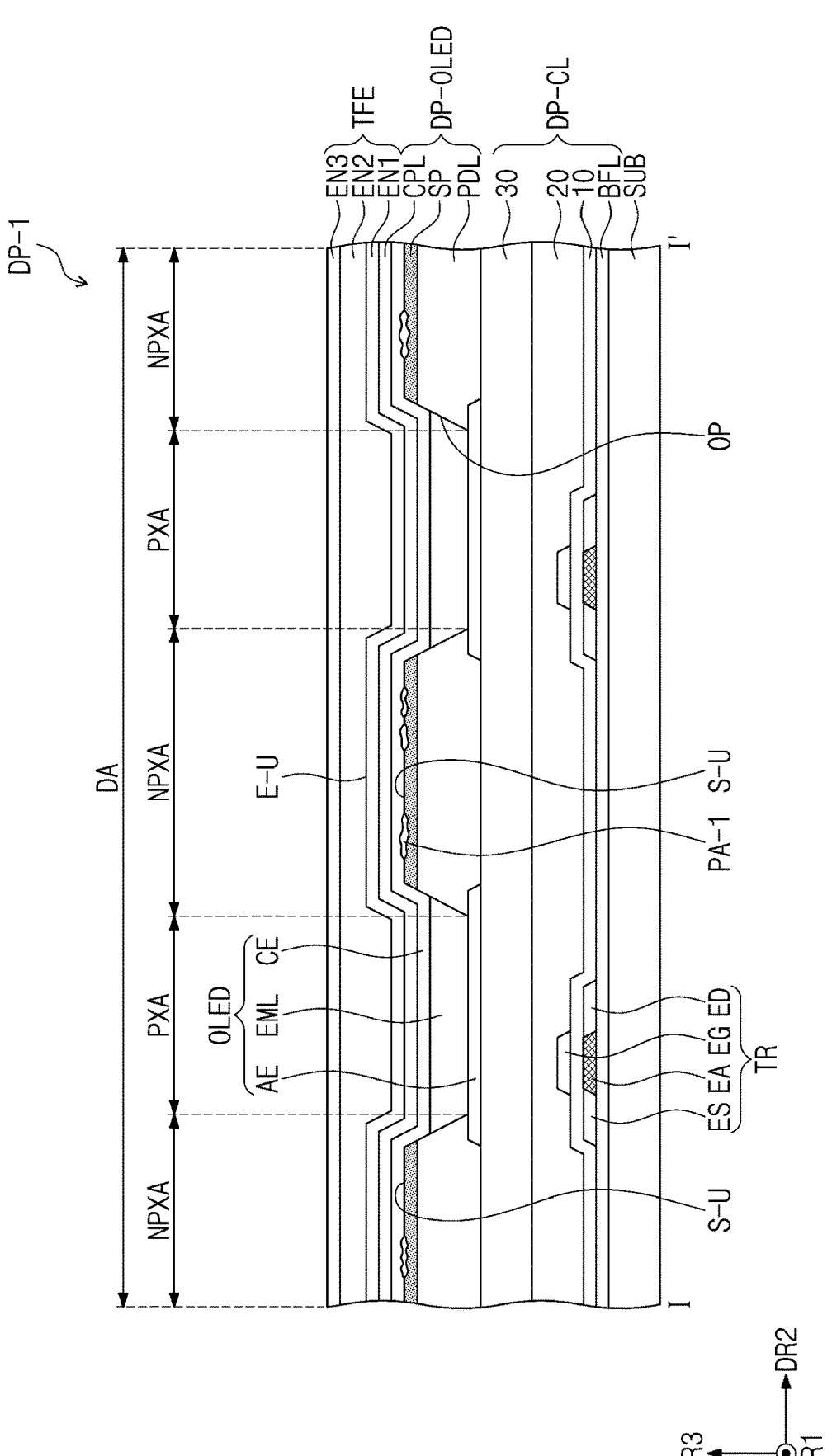
FIG. 3 is a schematic cross-sectional view of a display panel taken along line I-I' in FIG. 1 according to an embodiment.
Figure 4:
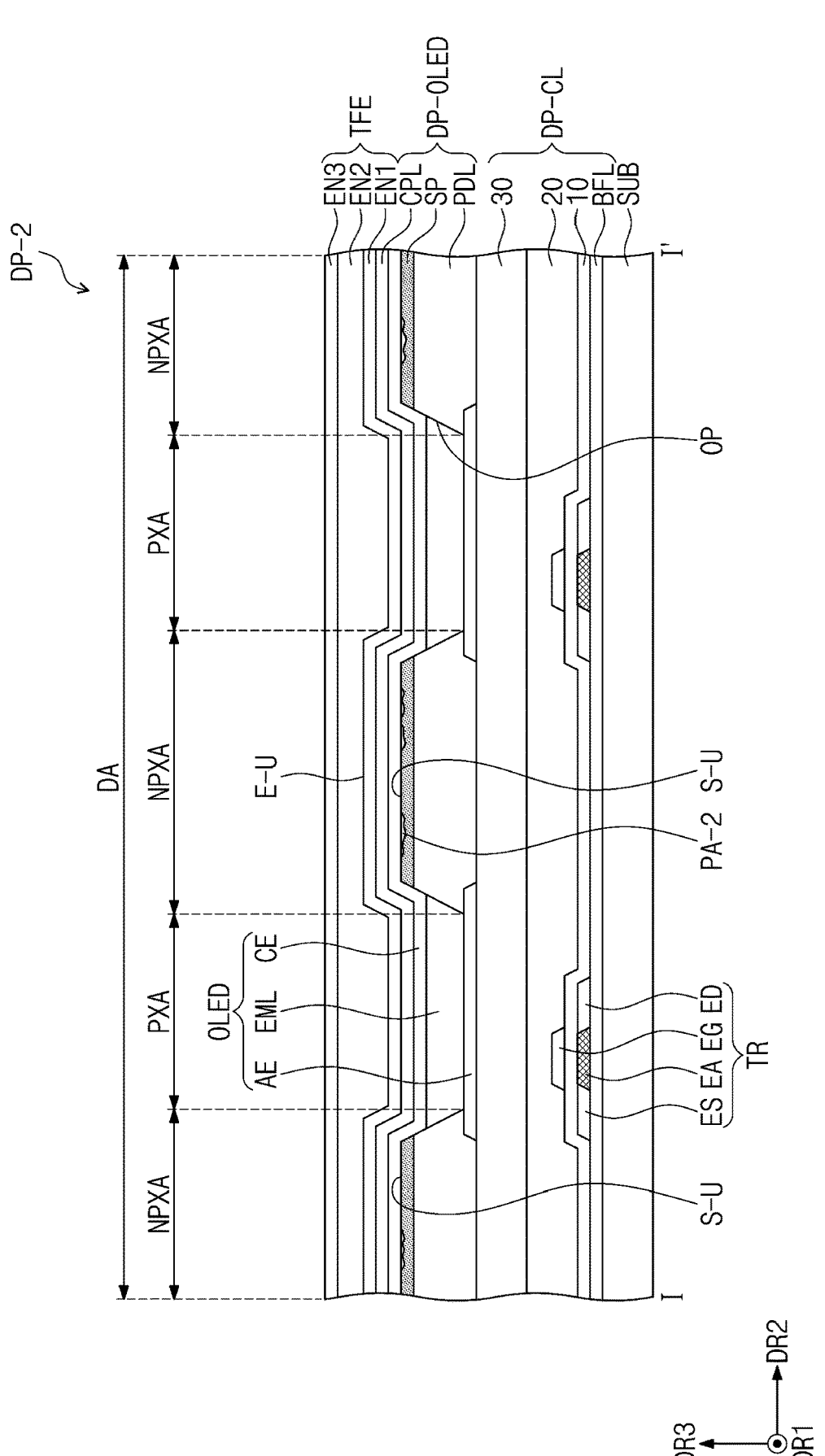
FIG. 4 is a schematic cross-sectional view of a display panel taken along line I-I' in FIG. 1 according to an embodiment.

FIG. 3 is a schematic cross-sectional view of a display panel taken along line I-I' in FIG. 1 according to an embodiment. FIG. 4 is a schematic cross-sectional view of the display panel taken along line I-I' in FIG. 1 according to an embodiment. The same/similar reference numerals or symbols are used for components same as/similar to those described with reference to FIGS. 1 and 2, and duplicate descriptions will be omitted.

Referring to FIG. 3, a display panel DP-1 according to an embodiment may include a base layer SUB, a circuit element layer DP-CL, a display element layer DP-OLED, and an encapsulation layer TFE which are sequentially stacked. Descriptions of the base layer SUB, the circuit element layer DP-CL, the display element layer DP-OLED, and the encapsulation layer TFE may correspond to those of the base layer SUB, the circuit element layer DP-CL, the display element layer DP-OLED, and the encapsulation layer TFE made with reference to FIG. 2, and thus the following description will be focused on differences from the display panel DP in FIG. 2.

A spacer SP according to an embodiment may be disposed on a pixel-defining layer PDL. The spacer SP may be disposed on an upper surface of the pixel-defining layer PDL in a non-light-emitting region NPXA. In the third direction DR3, a thickness of the spacer SP may be less than a thickness of the pixel-defining layer PDL. The spacer SP according to an embodiment may include an organic material. For example, the spacer SP may include polyimide.

Particles PA-1 may be disposed between the spacer SP and the second electrode CE. In an embodiment, the particles PA-1 may be partially inserted into an upper surface S-U of the spacer SP. This is because during compression of the particles PA-1, the particles PA-1 may be partially inserted into the spacer SP.

According to an embodiment, since a mask is removed after a process of depositing the light-emitting layer EML, and the particles PA-1 remaining on the spacer SP are partially inserted into the spacer SP, components disposed on the spacer SP may be formed flat in a region overlapping the spacer SP in a plan view. Accordingly, a display panel DP-1 including the first inorganic layer EN1 with an improved step coverage may be provided.

Referring to FIG. 4, a display panel DP-2 according to an embodiment may include a base layer SUB, a circuit element layer DP-CL, a display element layer DP-OLED, and an encapsulation layer TFE which are sequentially stacked. Descriptions of the base layer SUB, the circuit element layer DP-CL, the display element layer DP-OLED, and the encapsulation layer TFE may correspond to those of the base layer SUB, the circuit element layer DP-CL, the display element layer DP-OLED, and the encapsulation layer TFE made with reference to FIG. 2, and thus the following description will be focused on differences from the display panel DP in FIG. 2.

The spacer SP according to an embodiment may be disposed on the pixel-defining layer PDL. The spacer SP may be disposed on an upper surface of the pixel-defining layer PDL in the non-light-emitting region NPXA. In the third direction DR3, a thickness of the spacer SP may be less than a thickness of the pixel-defining layer PDL. The spacer SP according to an embodiment may include an organic material. For example, the spacer SP may include polyimide.

Particles PA-2 may be disposed between the spacer SP and the second electrode CE. In an embodiment, the particles PA-2 may be inserted entirely into the spacer SP. This is because during compression of the particles PA-2, the particles PA-2 may be inserted into the spacer SP.

The particles PA-2 may be partially exposed from an upper surface S-U of the spacer SP, and the particles PA-2 exposed from the upper surface S-U may be coplanar with the upper surface S-U.

According to an embodiment, since a mask is removed after a process of depositing the light-emitting layer EML, and the particles PA-2 remaining on the spacer SP are inserted into the spacer SP, components disposed on the spacer SP may be formed flat in a region overlapping the spacer SP in a plan view. Accordingly, a display panel DP-2 including the first inorganic layer EN1 with an improved step coverage may be provided.

Figure 5A:
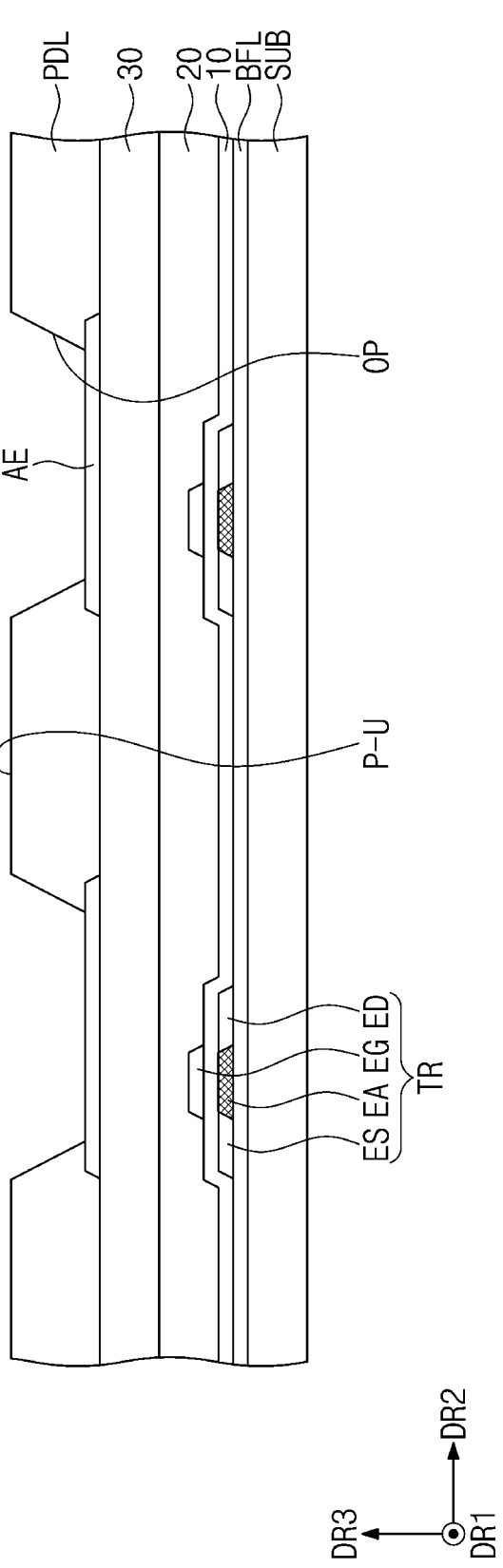
FIG. 5A is a schematic cross-sectional view of a method of manufacturing a display panel according to an embodiment of the disclosure.
Figure 5B:
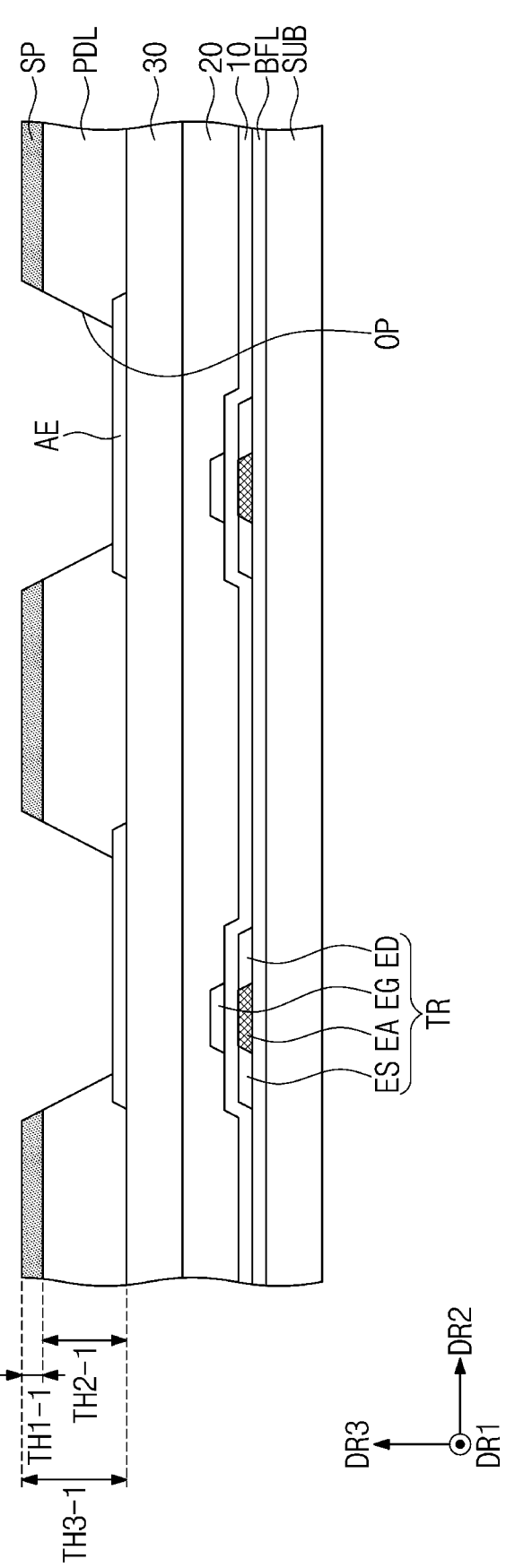
FIG. 5B is a schematic cross-sectional view of a method of manufacturing a display panel according to an embodiment of the disclosure.
Figure 5C:
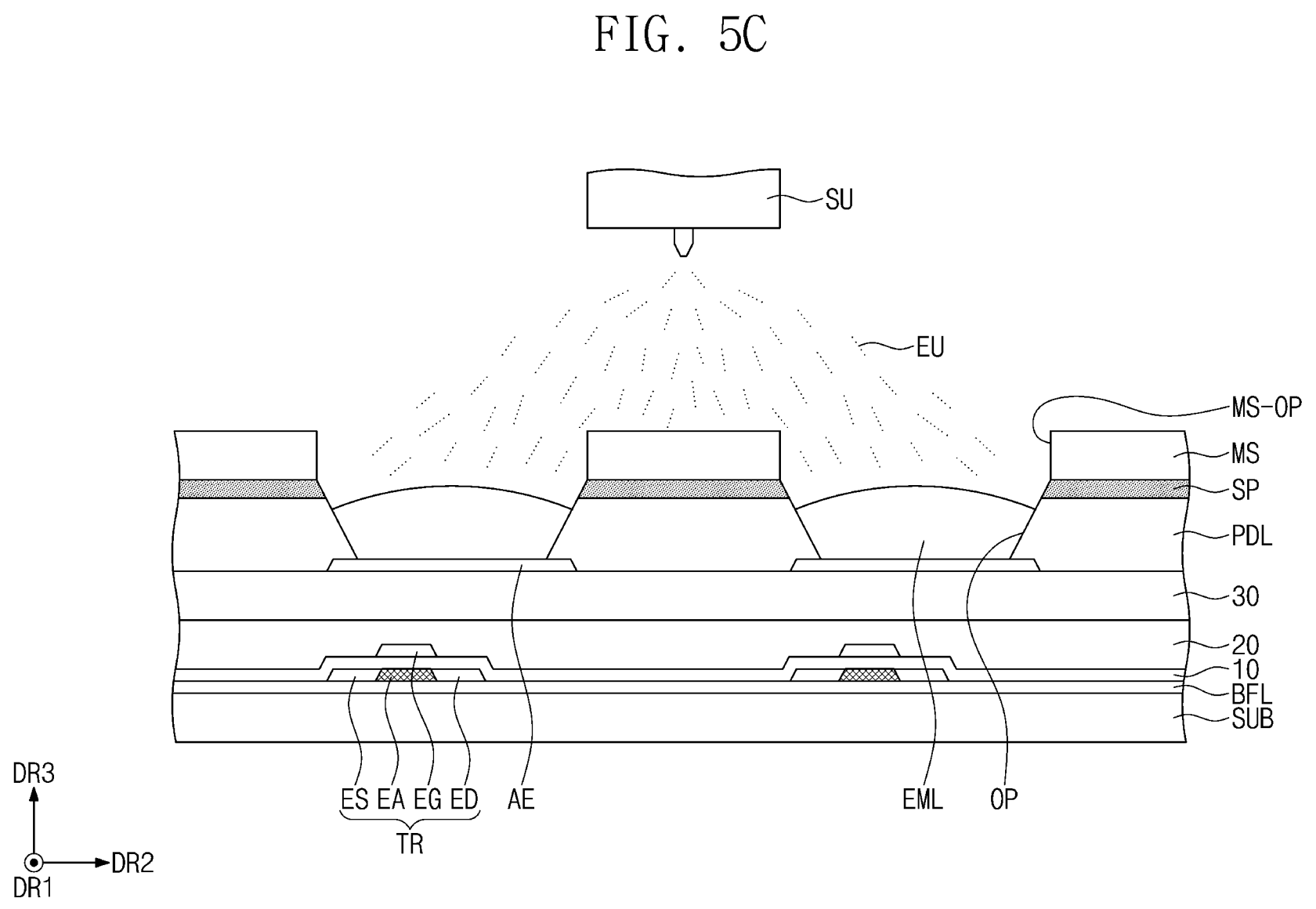
Figure 5D:
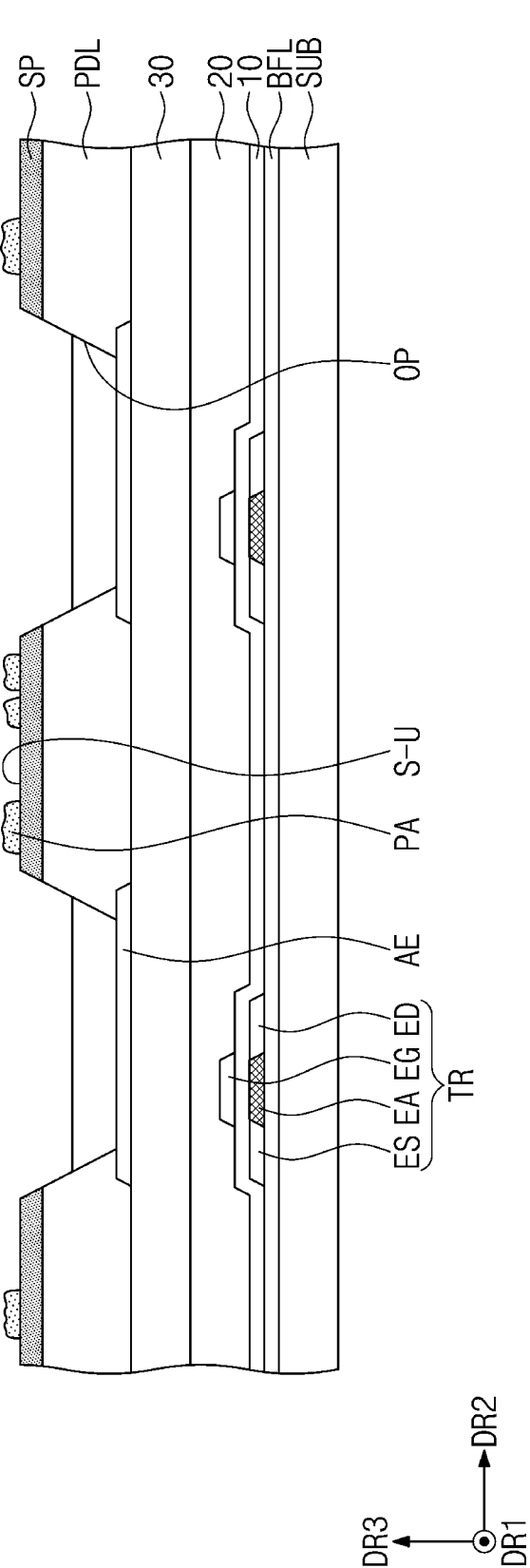
FIG. 5D is a schematic cross-sectional view of a method of manufacturing a display panel according to an embodiment of the disclosure.
Figure 5E:
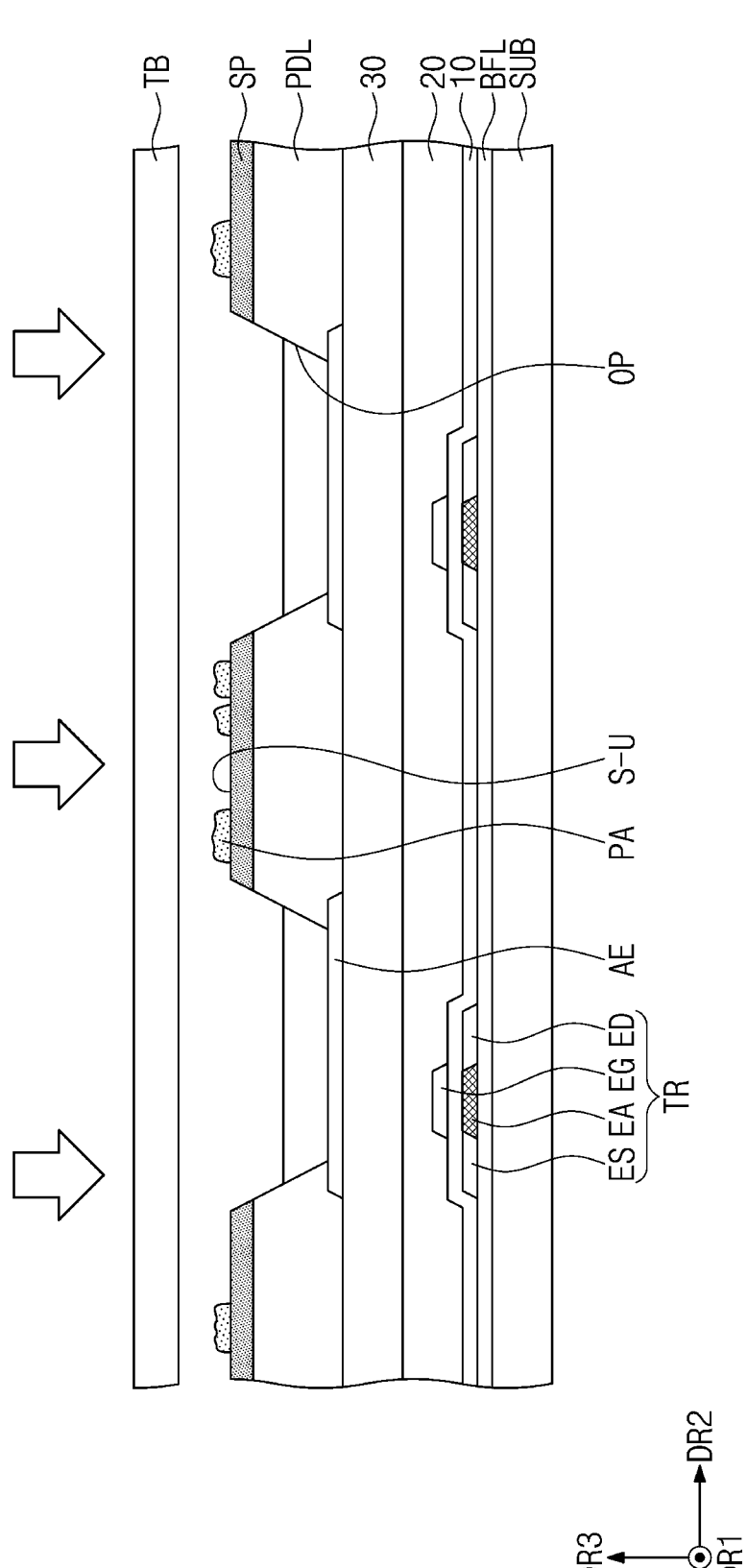
FIG. 5E is a schematic cross-sectional view of a method of manufacturing a display panel according to an embodiment of the disclosure.
Figure 5F:
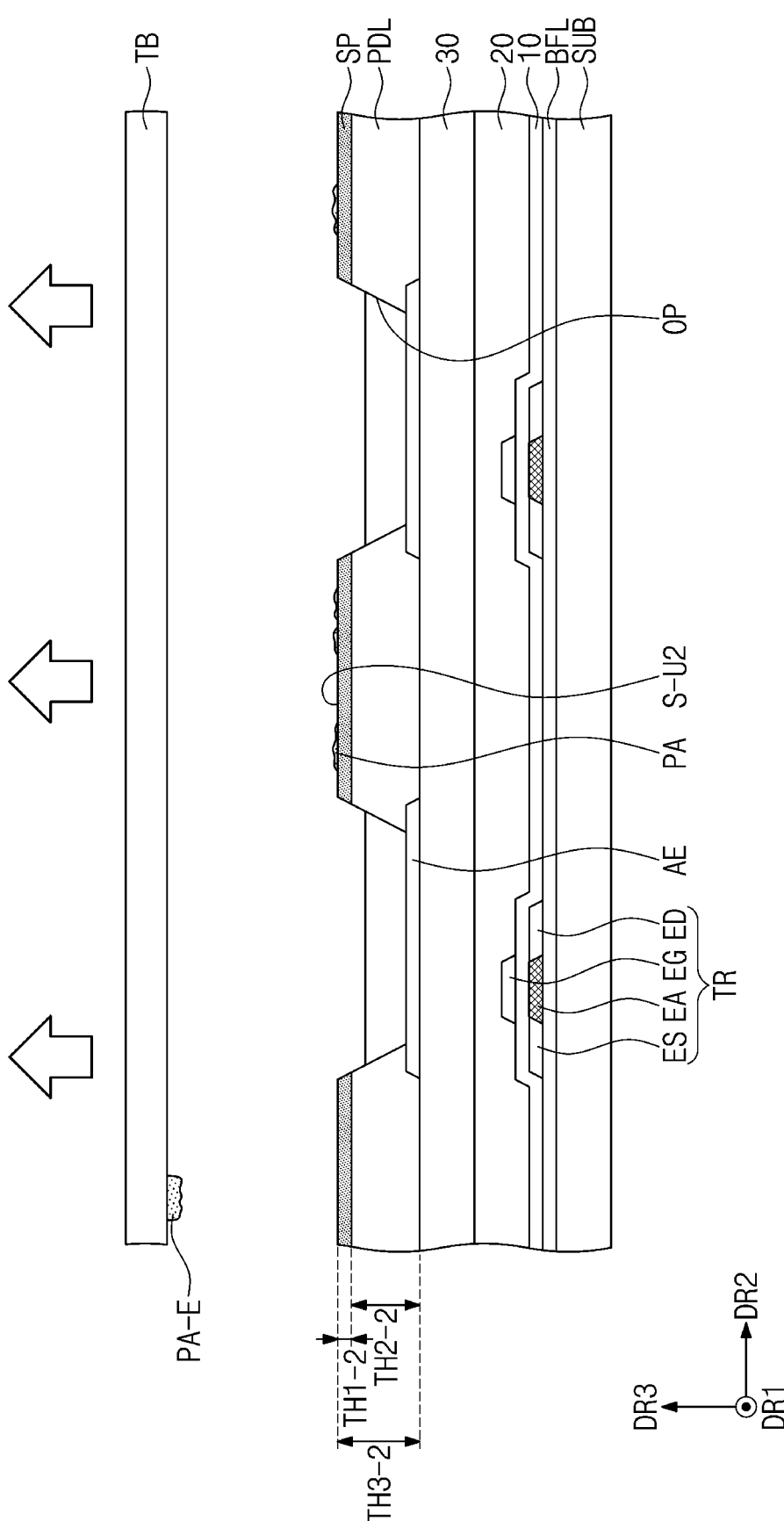
FIG. 5F is a schematic cross-sectional view of a method of manufacturing a display panel according to an embodiment of the disclosure.
Figure 5G:
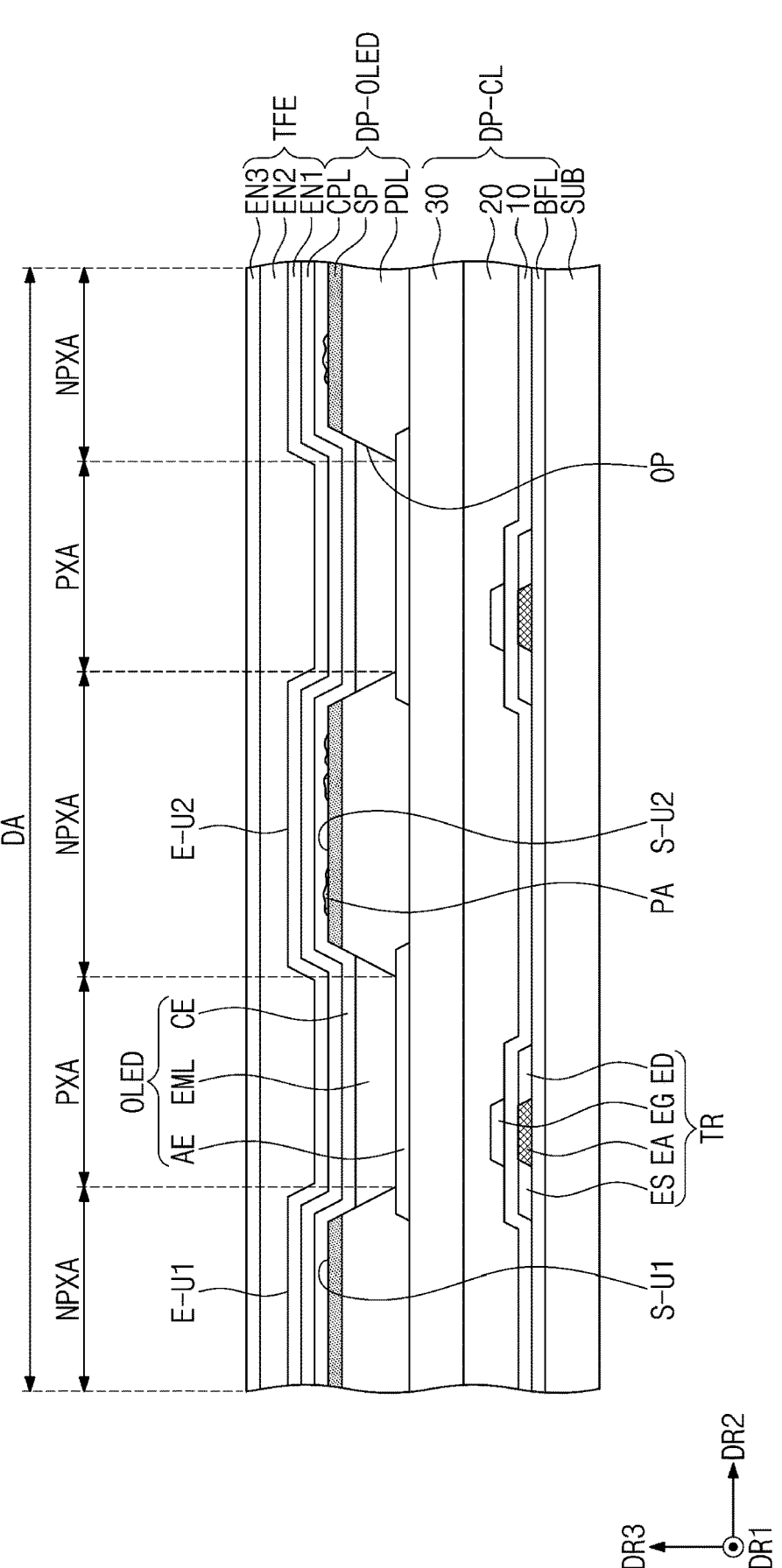
FIG. 5G is a schematic cross-sectional view of a method of manufacturing a display panel according to an embodiment of the disclosure.

FIG. 5A is a schematic cross-sectional view of a method of manufacturing a display panel according to an embodiment of the disclosure. FIG. 5B is a schematic cross-sectional view of a method of manufacturing a display panel according to an embodiment of the disclosure. FIG. 5C is a schematic cross-sectional view of a method of manufacturing a display panel according to an embodiment of the disclosure. FIG. 5D is a schematic cross-sectional view of a method of manufacturing a display panel according to an embodiment of the disclosure. FIG. 5E is a schematic cross-sectional view of a method of manufacturing a display panel according to an embodiment of the disclosure. FIG. 5F is a schematic cross-sectional view of a method of manufacturing a display panel according to an embodiment of the disclosure. FIG. 5G is a schematic cross-sectional view of a method of manufacturing a display panel according to an embodiment of the disclosure.

The same/similar reference numerals or symbols are used for components same as/similar to those described with reference to FIGS. 1 and 2, and duplicate descriptions will be omitted.

Referring to FIGS. 5A and 5B, a method of manufacturing a display panel according to an embodiment may include an operation of providing a work substrate.

The work substrate according to an embodiment may be provided in a state that a transistor TR, insulating layers BFL, 10, 20, and 30, a first electrode AE, and a pixel-defining layer PDL exposing at least a portion of the first electrode AE are formed on a base layer SUB.

The method of manufacturing a display panel according to an embodiment may include an operation of forming a spacer SP on the pixel-defining layer PDL. The spacer SP may be formed on an upper surface P-U of the pixel-defining layer PDL.

After a material of the spacer SP is formed on the pixel-defining layer PDL, the spacer SP may be formed through a patterning process. According to an embodiment, in the third direction DR3, a (1-1)-th thickness TH1-1 of the spacer SP may be less than a (2-1)-th thickness TH2-1 of the pixel-defining layer PDL. Before a compression process is performed, a sum of the (1-1)-th thickness TH1-1 and the (2-1)-th thickness TH2-1 may be defined as a (3-1)-th thickness TH3-1. The (1-1)-th thickness TH1-1 may be in a range of about 0.1 μm to about 0.5 μm, and the (2-1)-th thickness TH2-1 may be in a range of about 1 μm to about 5 μm.

Referring to FIGS. 5C and 5D, the method of manufacturing a display panel according to an embodiment may include an operation of forming a light-emitting layer EML.

The light-emitting layer EML may be formed inside a chamber that provides a space. The light-emitting layer EML may be formed in each corresponding opening OP by spraying a deposition material EU from a deposition source SU disposed inside the chamber.

The light-emitting layer EML may be formed after passing through a mask MS including deposition openings MS-OP. Each of the deposition openings MS-OP may correspond to corresponding one of the openings OP. The mask MS may be disposed on the spacer SP. The deposition material EU sprayed from the deposition source SU may pass through the deposition openings MS-OP and may be deposited on the first electrodes AE corresponding thereto.

The spacer SP may prevent an impact by the mask from being transmitted to the work substrate while the deposition process is being performed, and/or during adhering/detaching of the mask MS to/from the work substrate. Accordingly, the work efficiency and reliability of the deposition process may be improved.

After the deposition process is performed, an operation of removing the mask MS of the work substrate may be performed. The deposition material EU on the mask MS may remain on the upper surface S-U of the spacer SP after removal of the mask MS. The deposition material EU remaining on the upper surface S-U of the spacer SP may be particles PA. Accordingly, according to an embodiment, the particles PA and the deposition material EU may include a same material.

In case that a following process is performed with the particles PA remaining on the upper surface S-U of the spacer SP, step coverages of layers formed on the upper surface S-U of the spacer SP may be reduced due to the thicknesses of the particles PA. Accordingly, a process of removing and/or compensating the particles PA remaining on the upper surface S-U of the spacer SP may be required.

Referring to FIGS. 5E and 5F, the method of manufacturing a display panel according to an embodiment may include an operation of compressing the particles PA. The compressing of the particles PA may be performed by a compression tool TB pressing on the spacer SP.

According to an embodiment, while the compressing is performed, the compression tool TB may have a temperature of in a range of about 30° C. to about 100° C.

After the compressing is performed, the compression tool TB may be removed from the work substrate. Some particles PA-E may be removed from the work substrate by being adhered to the compression tool TB. Accordingly, the particles PA may not be disposed on a portion of the upper surface of the spacer SP.

The particles PA remaining on the spacer SP after the compressing may have less volume than those before the compressing. The second upper surface S-U2 of the spacer SP may have a planarized surface due to the particles PA having less volume, even after the following process is performed on the second upper surface S-U2 of the spacer SP.

After the compression process is performed by the compression tool TB, the spacer SP may have a (1-2)-th thickness TH1-2, and the pixel-defining layer PDL may have a (2-2)-th thickness TH2-2. According to an embodiment, the (1-2)-th thickness TH1-2 of the spacer SP may be about 0.1 μm less than the (1-1)-th thickness TH1-1 of the spacer SP before the compression process is performed. The (2-2)-th thickness TH2-2 of the pixel-defining layer PDL may be about 0.1 μm less than the (2-1)-th thickness TH2-1 of the pixel-defining layer PDL before the compression process is performed.

Accordingly, a (3-2)-th thickness TH3-2, which is a sum of the (1-2)-th thickness TH1-2 and the (2-2)-th thickness TH2-2, may be less than the (3-1)-th thickness TH3-1.

The method of manufacturing a display panel according to an embodiment may include an operating of removing and/or compensating the particles PA remaining on the spacer SP after the deposition process of the light-emitting layer EML, thereby improving the step coverage of layers formed on the spacer SP.

Referring to FIG. 5G, the method of manufacturing a display panel may further include an operation of forming the second electrode CE, an operation of forming the cover layer CPL, and an operation of forming the encapsulation layer TFE.

The second electrode CE may be formed to cover side surfaces of the pixel-defining layer PDL defining the spacer SP and the opening OP, and the light-emitting layer EML. The second electrode CE may include a conductive material. The cover layer CPL may be formed on the second electrode CE. The first inorganic layer EN1 of the encapsulation layer TFE may be formed on the cover layer CPL.

According to the method of manufacturing a display panel according to an embodiment, since the process of compressing the particles PA is performed, a flatness of a portion E-U1 of the first inorganic layer EN1 overlapping the first upper surface S-U1 on which the particles PA are not disposed, and a flatness of another portion E-U2 of the first inorganic layer EN1 overlapping the second upper surface S-U2 on which the particles PA are disposed may be substantially the same. Accordingly, the method of manufacturing a display panel including the first inorganic layer EN1 with improved step coverage may be provided.

Figure 6:
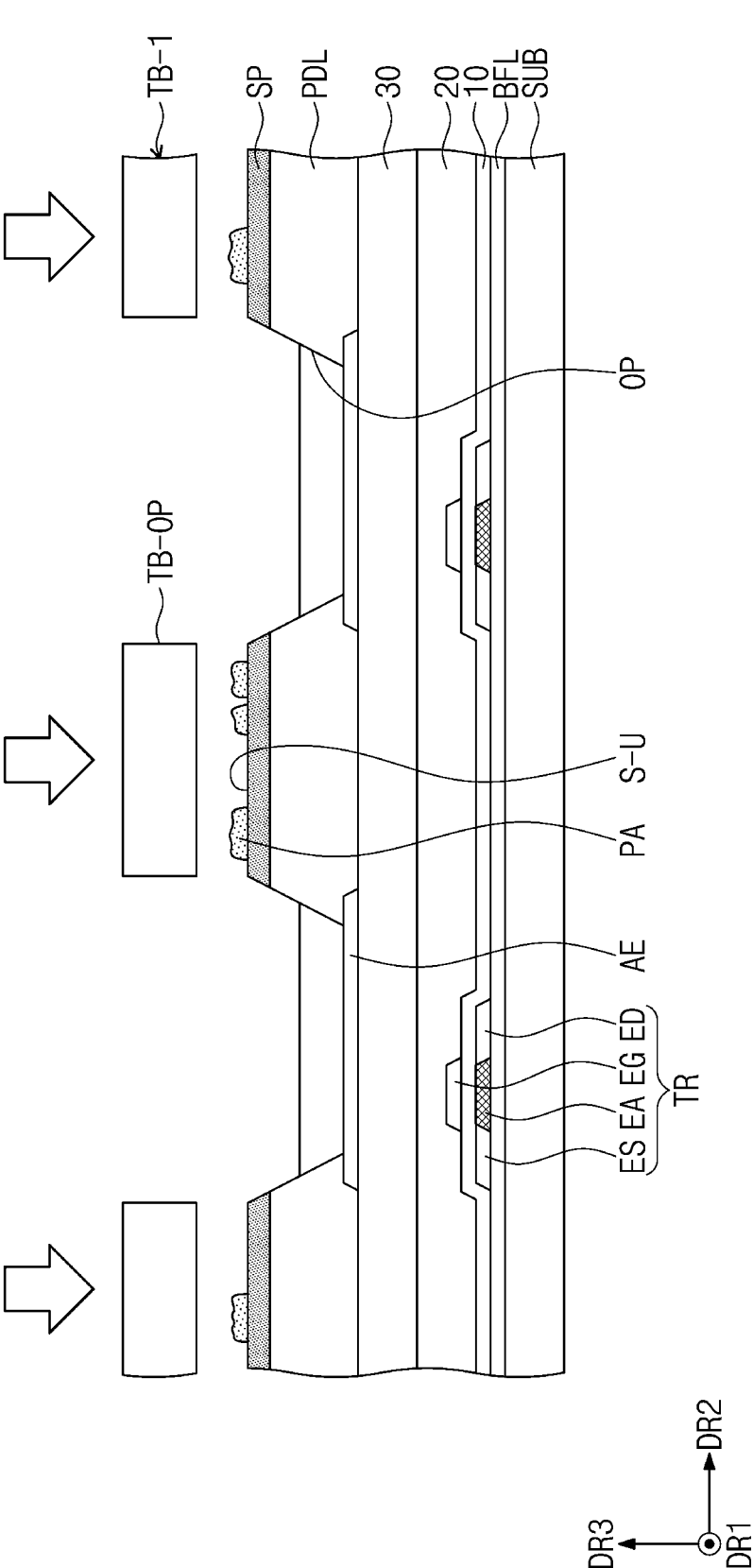
FIG. 6 is a schematic cross-sectional view of a compression tool according to an embodiment of the disclosure.
Figure 7:
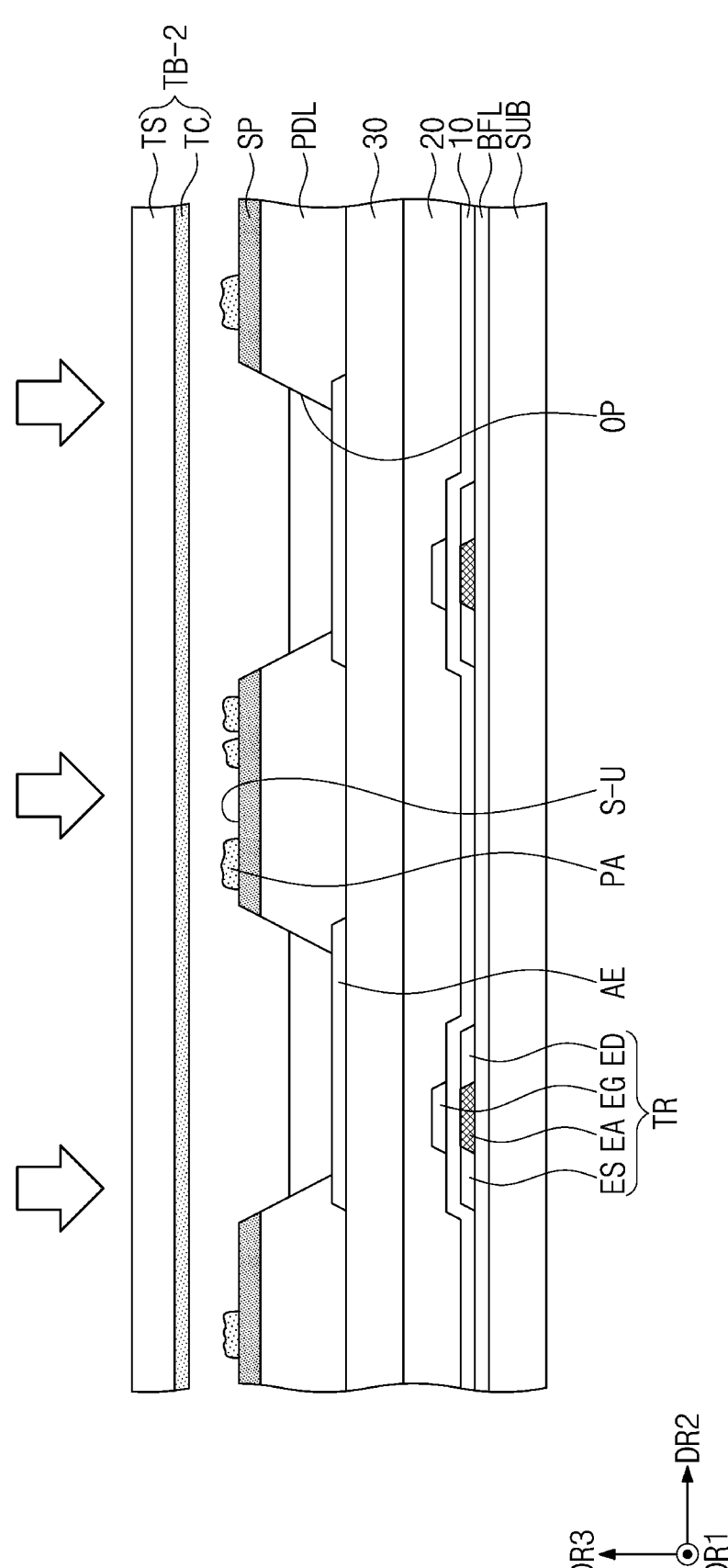
FIG. 7 is a schematic cross-sectional view of a compression tool according to an embodiment of the disclosure.

FIG. 6 is a schematic cross-sectional view of a compression tool according to an embodiment of the disclosure. FIG. 7 is a schematic cross-sectional view of the compression tool according to an embodiment of the disclosure. The same/similar reference numerals or symbols are used for components same as/similar to those described with reference to FIGS. 1 to 5G, and duplicate descriptions will be omitted.

FIGS. 6 and 7 each illustrates an embodiment of a compression tool TB-1 used in a process of compressing the particles PA in FIG. 5E.

Referring to FIG. 6, the compression tool TB-1 according to an embodiment may include compression openings TB-OP. The compression openings TB-OP may correspond to the openings OP.

According to an embodiment, the compression tool TB-1 and the mask MS described with reference to FIG. 5C may have a same shape in a plan view. The compression tool TB-1 and the mask MS may include a same material. Accordingly, the mask used as a substitute for the compression tool TB-1 and the mask MS used for forming the light-emitting layer EML may be the same.

Referring to FIG. 7, a compression tool TB-2 according to an embodiment may include a compression portion TS and a coating layer TC disposed under the compression portion TS.

During removal of the compression tool TB-2 from a work substrate as in FIG. 5F, the coating layer TC may more readily adhere the particles PA on the coating layer TC.

According to an embodiment of the disclosure, since an inorganic layer of an encapsulation layer is formed after a process of compressing particles remaining on a spacer, a display panel including the inorganic layer of the encapsulation layer with an improved step coverage may be provided.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A method of manufacturing a display panel, the method comprising:
   providing a work substrate including a first electrode and a pixel-defining layer including an opening exposing at least a portion of the first electrode;
   forming a spacer on the pixel-defining layer;
   forming a light-emitting layer on the first electrode by providing a deposition material to a mask including a deposition opening corresponding to the opening;
   removing the mask; and
   compressing particles remaining on the spacer by a compression tool,
   wherein each of the particles and the deposition material include a same material.

2. The method of claim 1, wherein the spacer comprises polyimide.

3. The method of claim 1, further comprising:
   forming a second electrode covering the light-emitting layer and the pixel-defining layer.

4. The method of claim 3, further comprising:
   forming a cover layer covering the second electrode.

5. The method of claim 4, further comprising:
   forming a first inorganic layer covering the cover layer;
   forming an organic layer covering the first inorganic layer; and
   forming a second inorganic layer covering the organic layer,
   wherein an upper surface of the first inorganic layer overlapping the particles in a plan view is flat.

6. The method of claim 4, wherein the compression tool and the mask have a same shape in a plan view.

7. The method of claim 1, wherein the compression tool compresses particles at a temperature in a range of about 30° C. to about 100° C.

8. The method of claim 1, wherein in the compressing of the particles, the particles are compressed onto an upper surface of the spacer.

9. The method of claim 1, wherein in the compressing of the particles, at least a part of each of the particles is inserted from an upper surface of the spacer into the spacer.

10. The method of claim 1, wherein in the compressing of the particles, at least some of the particles are adhered to the compression tool and removed from the spacer.

11. The method of claim 10, wherein the compression tool comprises a compression part and a coating layer disposed under the compression part, and the at least some of the particles are adhered to the coating layer and removed from the spacer.

12. The method of claim 1, wherein a sum of a thickness of the pixel-defining layer and a thickness of the spacer after the compressing of the particles is less than the sum of the thickness of the pixel-defining layer and the thickness of the spacer before the compressing of the particles in a thickness direction of the work substrate.

13. A display panel comprising:

a circuit element layer including a transistor and disposed on a base layer;

a display element layer including:

first electrodes electrically connected to the transistor;

a second electrode disposed in common on the first electrodes;

light-emitting layers, each disposed between a corresponding one of the first electrodes and the second electrode;

a pixel-defining layer including openings exposing at least a portion of each of the first electrodes and covered by the second electrode;

a spacer disposed between the pixel-defining layer and the second electrode, the spacer being disposed on an upper surface of the pixel-defining layer in a non-light-emitting region; and a plurality of discrete particles disposed between the spacer and the second electrode; and an encapsulation layer disposed on the display element layer, wherein each of the plurality of discrete particles and the light-emitting layers include a same material.

14. The display panel of claim 13, wherein the encapsulation layer comprises:

a first inorganic layer disposed on the second electrode;

a second inorganic layer disposed on the first inorganic layer; and an organic layer disposed between the first inorganic layer and the second inorganic layer.

15. The display panel of claim 14, wherein the display element layer further includes a cover layer disposed between the second electrode and the first inorganic layer.

16. A display panel comprising:

a pixel including a transistor, a first electrode electrically connected to the transistor, a second electrode disposed on the first electrode, and a light-emitting layer disposed between the first electrode and the second electrode;

a pixel-defining layer including an opening exposing at least a part of the first electrode and covered by the second electrode;

a spacer disposed between the pixel-defining layer and the second electrode, the spacer being disposed on an upper surface of the pixel-defining layer in a non-light-emitting region;

a plurality of discrete particles disposed between the spacer and the second electrode; and an encapsulation layer including:

a first inorganic layer disposed on the second electrode;

a second inorganic layer disposed on the first inorganic layer; and an organic layer disposed between the first inorganic layer and the second inorganic layer, wherein an upper surface of the first inorganic layer overlapping the plurality of discrete particles in a plan view is flat.

17. The display panel of claim 16, wherein each of the plurality of discrete particles and the light-emitting layer include a same material.

18. The display panel of claim 16, further comprising:

a cover layer disposed between the second electrode and the first inorganic layer.

19. The display panel of claim 16, wherein the spacer comprises polyimide.

\*    \*    \*    \*    \*